United States Patent [19]
Miyachi et al.

[11] Patent Number: 5,861,603
[45] Date of Patent: Jan. 19, 1999

[54] MASK STRUCTURE AND METHOD OF MAKING THE SAME

[75] Inventors: Takeshi Miyachi, Zama; Hiroshi Maehara, Yokohama; Masatake Akaike, Atsugi, all of Japan

[73] Assignee: Canon Kabushiki Kaisha, Tokyo, Japan

[21] Appl. No.: 884,622

[22] Filed: Jun. 27, 1997

Related U.S. Application Data

[63] Continuation of Ser. No. 629,078, Apr. 8, 1996, abandoned, which is a continuation of Ser. No. 213,502, Mar. 16, 1994, abandoned.

[30] Foreign Application Priority Data

Mar. 16, 1993 [JP] Japan .................................. 5-055850
Jan. 27, 1994 [JP] Japan .................................. 6-007621

[51] Int. Cl.[6] ................................................. B23K 26/00
[52] U.S. Cl. ............................... 219/121.85; 219/121.64; 156/272.8; 156/273.1; 430/5
[58] Field of Search ........................... 219/121.6, 121.63, 219/121.64, 121.84, 121.85, 121.86; 156/272.8, 273.1, 379.6, 80, 282, 498; 65/36, 40; 430/5

[56] References Cited

U.S. PATENT DOCUMENTS

| 4,278,867 | 7/1981 | Tan ..................................... 219/121.64 |
| 4,294,602 | 10/1981 | Horne ........................................... 65/40 |
| 4,680,243 | 7/1987 | Shimkunas et al. ......................... 430/5 |
| 4,862,490 | 8/1989 | Karnezos et al. ........................ 378/161 |
| 4,957,835 | 9/1990 | Aden ........................................... 430/5 |
| 5,194,710 | 3/1993 | McDaniel et al. ................. 219/121.63 |
| 5,370,842 | 12/1994 | Miyazaki et al. .................... 422/82.06 |

FOREIGN PATENT DOCUMENTS

| 60-186840 | 9/1985 | Japan . |
| 1-196133 | 8/1989 | Japan . |
| 1-266722 | 10/1989 | Japan . |
| 3-29313 | 2/1991 | Japan . |
| 4-330711 | 11/1992 | Japan . |
| 5-201752 | 8/1993 | Japan . |

OTHER PUBLICATIONS

Anthony, "Anodic Bonding of Imperfect Surfaces," Jour. Appl. Phys., vol. 54, No. 5, May, 1983, pp. 2419 through 2428.

*Primary Examiner*—Gregory L. Mills
*Attorney, Agent, or Firm*—Fitzpatrick, Cella, Harper & Scinto

[57] ABSTRACT

A method of manufacturing a mask in which laser radiation is projected to a mask substrate of silicon and a supporting frame of heat resisting glass, while a voltage of about 1000–10000 V is applied between the mask substrate and the supporting frame. Cooling water is caused to flow to suppress temperature rise due to the irradiation, to maintain the mask substrate and the supporting frame at a predetermined normal temperature (about the mask temperature in a lithographic pattern transfer process). The light projecting step is performed for a period not shorter than 10 minutes whereby anodic bonding of the mask substrate with the supporting frame is achieved. This prevents a shift of the mask pattern and/or deformation of the mask substrate, and it assures the manufacture of a high precision mask.

7 Claims, 11 Drawing Sheets

MASK STRUCTURE AND METHOD OF MAKING THE SAME

This application is a continuation of application Ser. No. 08/629,078, filed Apr. 8, 1996, now abandoned, which is a continuation of application Ser. No. 08/213,502, filed Mar. 16, 1994, now abandoned.

FIELD OF THE INVENTION AND RELATED ART

This invention relates to the manufacture of a mask to be used in an exposure apparatus, for example.

In the manufacture of an X-ray mask for use in an X-ray exposure apparatus, generally a membrane of SiN or SiC, for example, is provided on a Si substrate. An upper surface of it the Si substrate is patterned by an X-ray absorbing material of Au or Ta, for example, and the lower surface of the Si substrate is back-etched. Since the back-etched Si substrate has a low rigidity, it is fixed by adhesion to a supporting frame of a heat resisting glass material, for example, whereby it is reinforced.

For bonding an X-ray mask to a supporting frame, use of an epoxy (series) adhesive agent has been proposed (e.g., Japanese Laid-Open Patent Application, Laid-Open No. 266722/1989 or Japanese Laid-Open Patent Application, Laid-Open No. 29313/1991). FIG. 13 is a sectional view of an X-ray mask in which an X-ray mask substrate is fixed to a supporting frame with an epoxy adhesive agent. A SiN membrane 4 is provided on a Si substrate 1, and an X-ray absorbing material pattern 5 is formed on the membrane 4. This X-ray mask substrate is fixed to a supporting frame 2 with an adhesive agent 3.

As another example, an anodic bonding method has been proposed (Japanese Published Patent Application, Publication No. 66096/1992,which corresponds to Japanese Laid-Open Patent Application, Laid-Open No. 186840/1985). The principle of this anodic bonding method is discussed in detail in "Anodic Bonding of Imperfect Surfaces" by Thomas R. Anthony, "Journal of Applied Physics", 54(5), 1983. FIG. 14 is a sectional view of an X-ray mask manufactured in Accordance with the anodic bonding method. Except for the adhesive agent layer, the mask has the same structure as that of the FIG. 13 example. In the FIG. 14 example, an X-ray mask substrate 1 is fixed to a supporting frame 2 with a bonding voltage of 1000 to 3000 V. and a bonding temperature of 200 to 400 deg.(C.), in a period not shorter than 10 min.

SUMMARY OF THE INVENTION

In an X-ray mask manufactured by using an adhesive agent, there is a problem of setting and contraction of the adhesive agent material which may cause a shift of an absorbing material pattern. Also, there is another problem of a change with time due to moisture absorption of the adhesive agent.

In the anodic bonding method, on the other hand, an X-ray mask substrate and a supporting frame are exposed to a high temperature during the bonding process. This results in that, as regards the linear expansion coefficients of the Si material of the X-ray mask substrate and the heat resisting glass material of the supporting frame, the elongation percentages are inverted between a normal temperature and a high temperature (about 400 deg.(C.)), more particularly, at a temperature of about 250 deg.(C.). Consequently, the X-ray mask and the supporting frame, bonded to each other under a high temperature, have different elongation percentages between a normal temperature and a high temperature, and this may cause deformation of the X-ray mask substrate of smaller rigidity, resulting in an undesirable shift of a pattern.

If a SiC ceramics material of high rigidity is used for a supporting frame, since the SiC material has a layer linear expansion coefficient about twice that of the Si material, the X-ray mask substrate may be broken as the temperature returns to the normal temperature after the bonding.

Japanese Laid-Open Patent Application, Laid-Open No. 330711/1992 proposes making a glass material in a specific way to obtain a material having linear expansion coefficient approximately the same as that of the Si material. However, the proposed method still involves a heating process of about 400 deg.(C.). Am a result, there remains a problem of adverse effect to an X-ray absorbing material pattern (e.g., a change of internal stress of an absorbing material film which may lead to a shift of the pattern).

It Is accordingly an object of the present invention to provide a method and/or an apparatus for manufacturing a high-precision mask, by which an unwanted mask pattern shift or an unwanted deformation of an X-ray mask substrate is prevented.

In one preferred form of the present invention, there is provided a method of manufacturing a mask in which a mask substrate and a supporting frame are bonded to each other in an anodic bonding process, wherein a coherent radiation is projected while a voltage is applied between the mask substrate and the supporting frame. In this method, the substrate and the frame are bonded to each other through the irradiation and they are not exposed to a high temperature Thus, there occurs no pattern shift or deformation or breaking of the mask substrate and/or the supporting frame, These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1A:
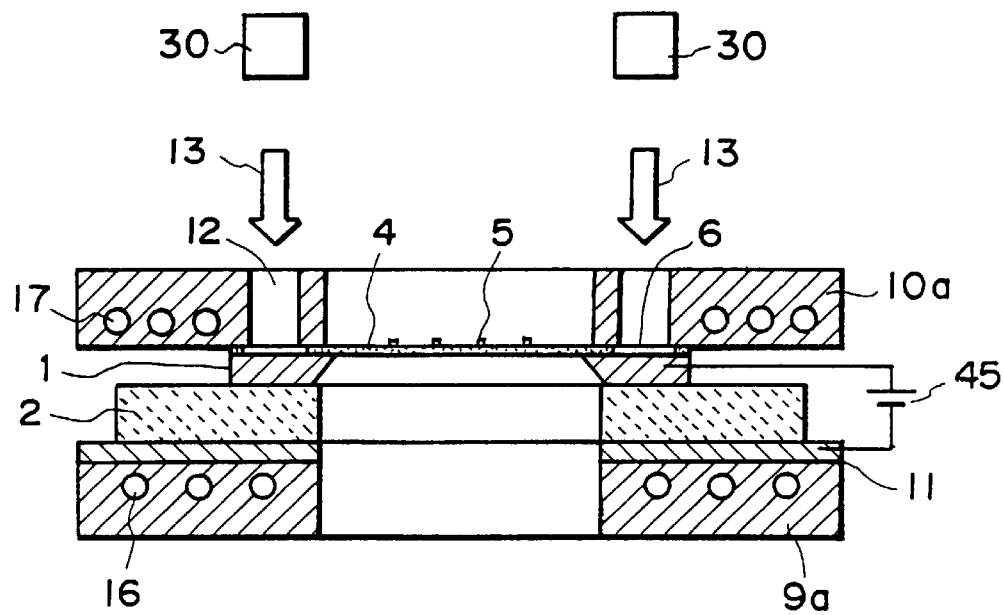
FIGS. 1A, 1B and 1C are schematic views for explaining a first embodiment of the present invention.

FIG. 1A shows a main portion of a mask manufacturing apparatus according to a first embodiment of the present invention.

Denoted at 1 is a mask substrate, and denoted at 2 is a supporting frame which is made of a heat resisting glass material such as Pyrex (trademark), for example. A membrane 4 of SiN material is provided on the upper surface of the glass substrate 1, and a pattern (e.g., a semiconductor circuit pattern) 5 of X-ray absorbing material is formed on the membrane 4.

Initially, the glass supporting frame 2 is registered to the mask substrate 1 while being precisely aligned with the pattern 5. After this, they are placed on a first base 9*a* having an electrically conductive member 11 attached thereto. Then, a second base 10*a* is placed and fixed on them Denoted at 30 are infrared laser sources each being a carbon dioxide gas laser, for example. Denoted at 45 is a voltage source for producing a high voltage of 1000 to 4000 V., for providing a flow of an electric current of a few $\mu$A between the mask substrate 1 and the conductive member 11.

While a high voltage is being applied between the mask substrate 1 and the conductive member 11, infrared laser radiation 13 produced by the laser source 30 is projected to the X-ray mask substrate (Si substrate) 1 through openings 12 (in this example, four openings defined along a circumferential direction) which are formed in the second base 10*a*. In each portion to be irradiated with the laser radiation 13, the membrane material is removed beforehand to provide an irradiation window 6. The laser radiation 13 goes through the X-ray mask substrate (Si) and impinges on the bonding area (the boundary between the supporting frame and the mask substrate).

In order to suppress temperature rise due to irradiation with the laser radiation cooling water is flowns through a cooling pipe 16 ill the first base 9*a* and through a cooling pipe 17 in the second base 10*a*. By this, the mask substrate 1 and the supporting frame 2 are maintained at a predetermined normal temperature (about the mask temperature in a lithographic pattern transfer process in which the X-ray mask is actually used). The laser radiation projection continues for a period not shorter-than 10 min., whereby anodic bonding of the mask substrate 1 and the supporting frame 2 is made.

The anodic bonding of this embodiment uses irradiation with coherent radiation. More specifically, while a voltage is applied between the Si mask substrate (conductive member) and the glass supporting frame, radiation is simultaneously projected, which radiation is effective to loosen the network structure of the glass material and also to facilitate dispersion of modifier ions in the glass. By this, at a low temperature the network structure of the glass is loosened while on the other hand the modifier ions are dispersively moved to the cathode side, such that a large electrostatic attraction force is produced between the conductive member and the glass and, as a result, they are bonded to each other (solid phase bonding).

Figures 1B, 1C:
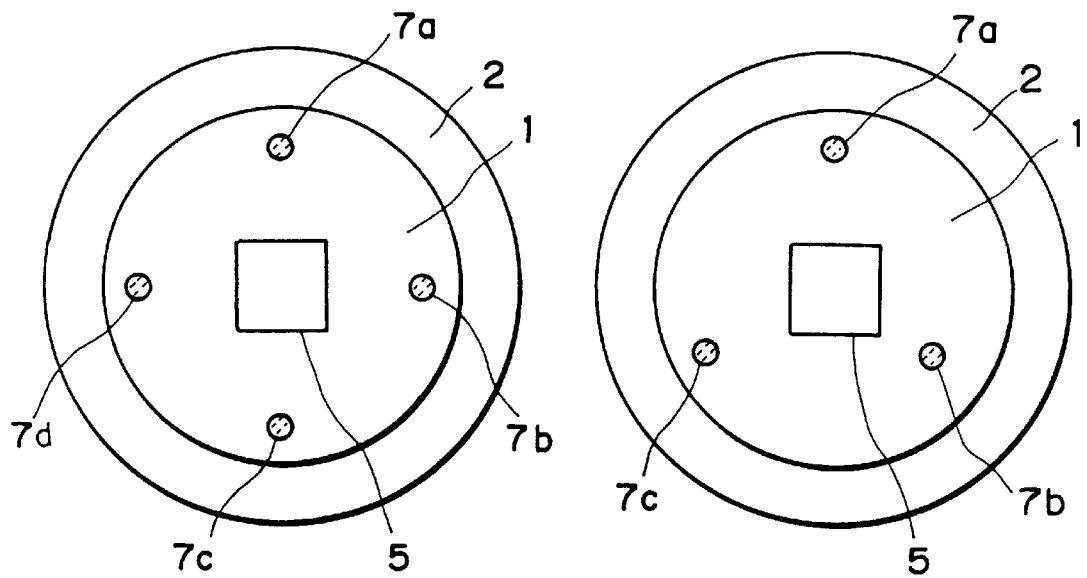

FIG. 1B illustrates the X-ray mask substrate 1 and the glass supporting frame 2 which are anodically bonded to each other as described, at four bonding points 7*a*–7*d*. This is called "spot bonding" with infrared laser radiation of a beam diameter of 1–10 mm. For enhanced cooling efficiency, the bonding (laser beam projection) is done in a diagonal order: a first shot is at 7*a*, a second shot is at 7*c*, a third shot is at 7*b* and a fourth shot is at 7*d*. This is done to increase heat dispersion. However, the radiation projection may be such that all the bonding points may be irradiated with laser beams simultaneously. Further, while in this embodiment the bonding is done at four locations, the layout of the openings 12 in the second base 10*a* may be modified to determine a desired number of bonding points, for example, in a range from one (1) to several tens. FIG. 1C illustrates an example of three-point bonding, at points 7*a*–7*c*.

Figure 2:
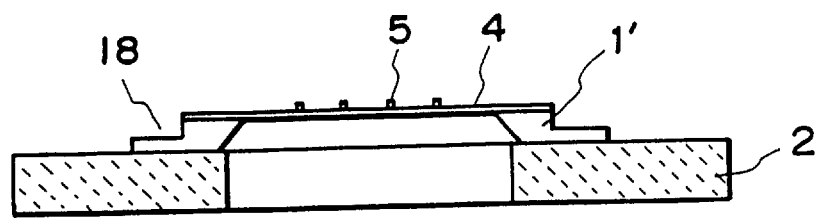
FIG. 2 illustrates a modified form of a mask.

FIG. 2 illustrates a modified form of a mask, wherein an anodic bonding area at an upper and outer peripheral portion of an X-ray mask substrate (Si) 1' is partially cut to reduce the thickness. This is effective to reduce the energy absorbed as the infrared laser radiation passes through the Si substrate and thus to reduce the time necessary for the anodic bonding.

In the examples described above, the X-ray mask substrate 1 on which the X-ray absorbing material 5 is provided beforehand is fixed to the supporting frame 2 through the anodic bonding process. However, an X-ray mask substrate without an X-ray absorbing material may be first bonded to a glass supporting frame through the anodic bonding process and, thereafter, the X-ray absorbing material may be provided on the mask substrate.

Embodiment 2

Figure 3A:
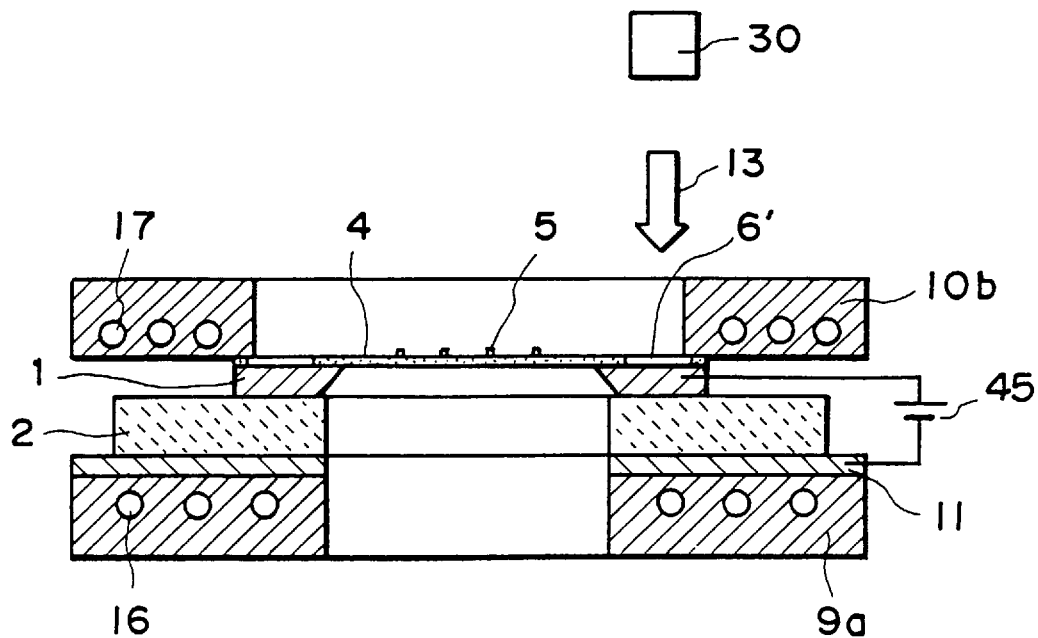
FIGS. 3A and 3B are schematic views for explaining a second embodiment of the present invention.
Figure 3B:
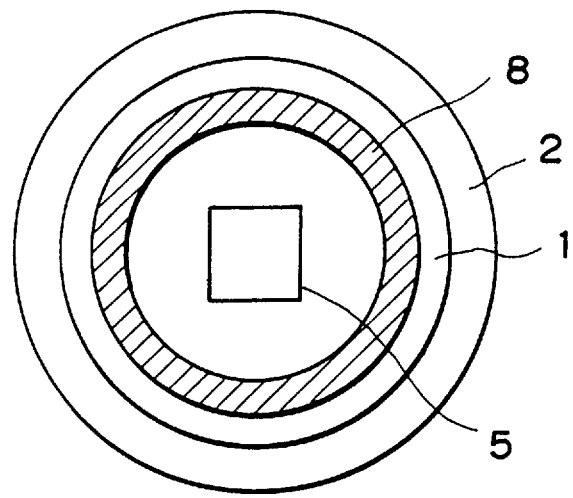

Next, a description will be made of another embodiment of the present invention which uses infrared laser radiation as in the first embodiment. Referring to FIG. 3A, the structure illustrated in this drawing is the same as that of the first embodiment, except for the shape of the second base 10*b* and the irradiation window 6. The second base 10*b* has an enlarged inside diameter so as not to interfere with the laser, and the infrared laser radiation is projected to the X-ray mask in a circular shape. Here, the infrared laser is scanningly deflected along a circumferential direction at a slow rotating speed, such as 0.5–2 (time/rotation) for example, whereby ring-like anodic bonding is made at the bonding area 8 (FIG. 3B). In place of scanningly deflecting the laser light the laser may be held fixed and the mask supporting mechanism may be rotated.

Figure 4:
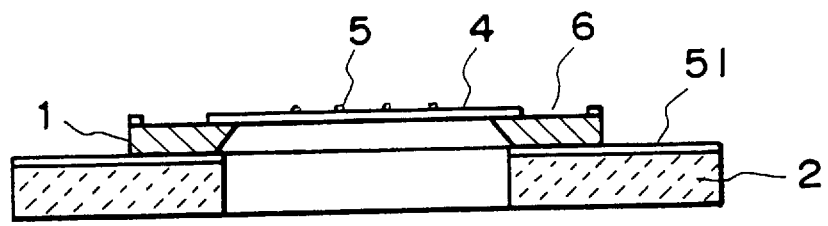
FIG. 4 illustrates a modified form of a mask.

FIG. 4 illustrates a modified form of a mask, wherein the supporting frame 2 is made of SiC. Because of an absence of modifier ions, Si material of the X-ray mask substrate 1 and SiC material of the supporting frame 2 are not bonded by an anodic bonding process. In consideration of this, and to facilitate the bonding, a glass film 51 having a thickness of about 0.5–2 microns is provided on the bonding surface of the SiC supporting frame 2 through a vacuum deposition process or a sputtering film formation process. Here, in order to increase the intimateness between the SiC frame and the glass film, a film of metal such as Al or Cr, for example, may preferably be provided therebetween with a thickness of 0.05–0.1 micron.

Embodiment 3

Figure 5:
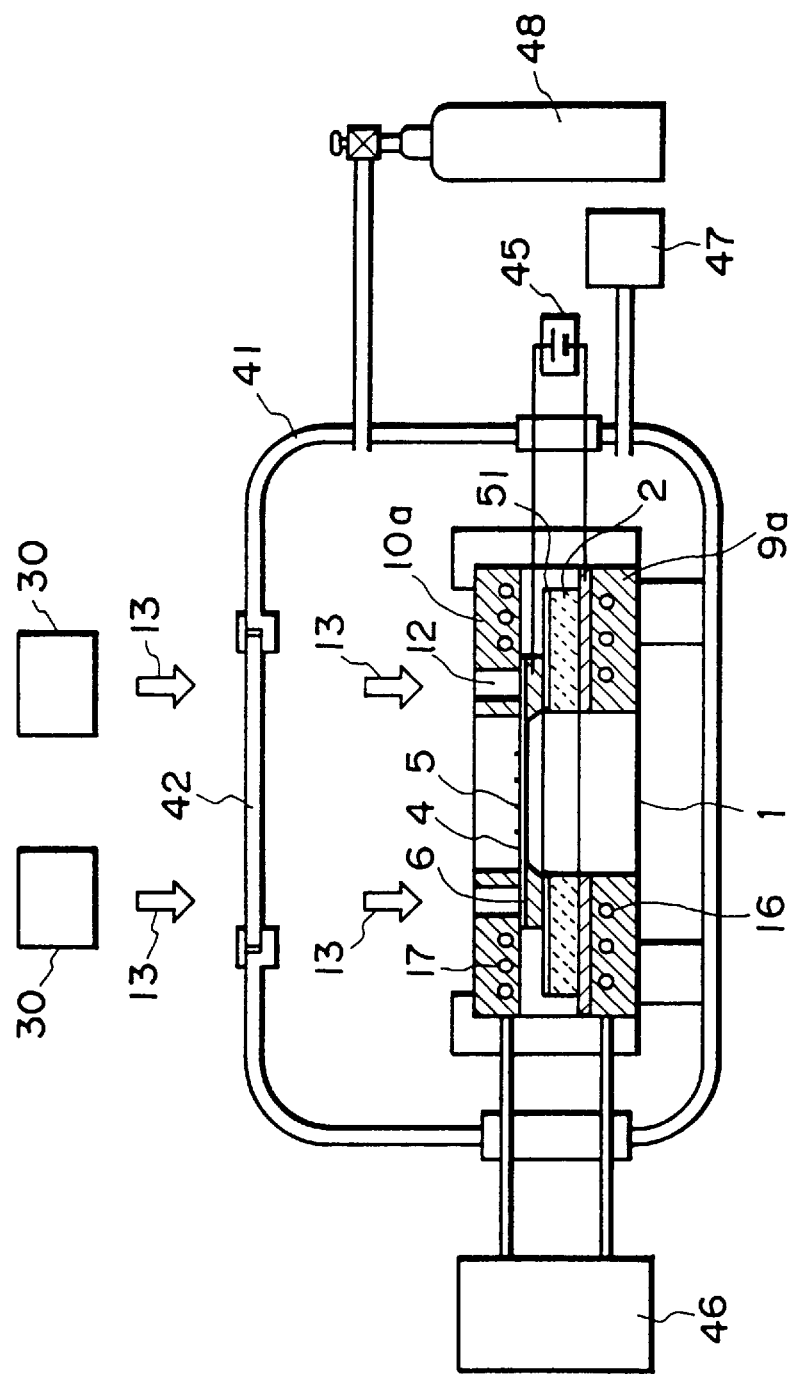
FIG. 5 is a schematic view for explaining a third embodiment of the present invention.

FIG. 5 illustrates a general arrangement of a mask manufacturing apparatus according to a third embodiment of the present invention. Like numerals as those of the foregoing embodiments are assigned to corresponding elements.

Basically, this embodiment corresponds to such a form that the structure shown in FIG. 1 is accommodated in a gastight chamber 41. The gastight chamber 41 is provided with a window member 42 for introduction of infrared laser 13, from outside of the chamber. The window member 42 may preferably be made of a material having a high infrared radiation transmissivity, such as $Al_2O_3$, $SiO_2$, ZnSe or KBr. Disposed outside the chamber 41 are a voltage source 45 for voltage application, a temperature adjusting device 46 for temperature adjustment during the bonding process, a vacuum pump for supplying vacuum into the chamber 41, and a container 48 for supplying inert gas.

With the structure described above, the inside of the chamber 41 is filled with a high vacuum or an inert gas of a predetermined pressure (atmospheric pressure), and anodic bonding of a mask substrate and a supporting frame 2 is effected within the chamber. This is effective to prevent oxidization, of the bonding surface, whereby tightness of anodic bonding is improved.

Embodiment 4

Figure 6A:
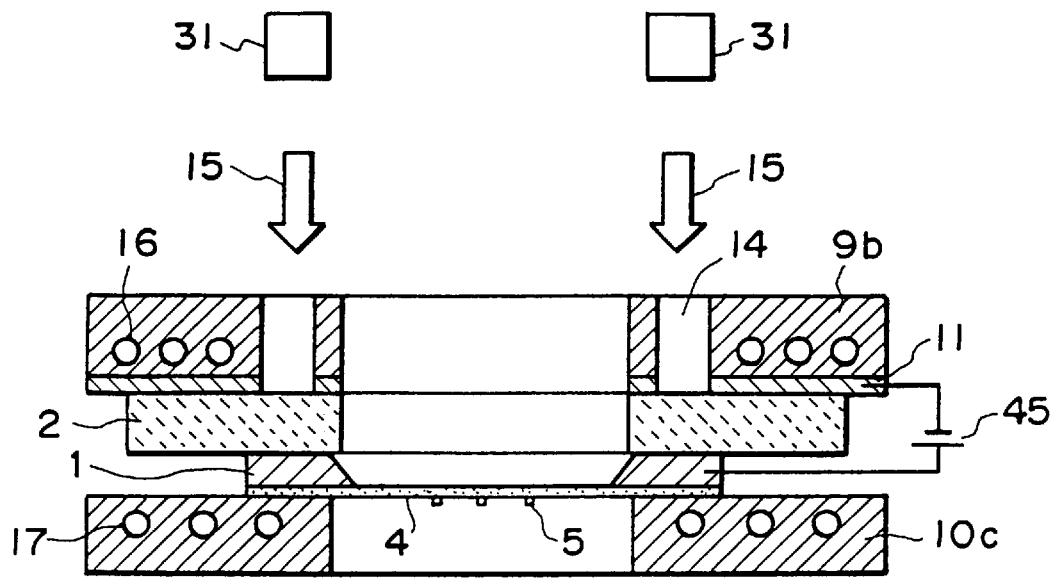
FIGS. 6A and 6B are schematic views for explaining a fourth embodiment of the present invention.
Figure 6B:
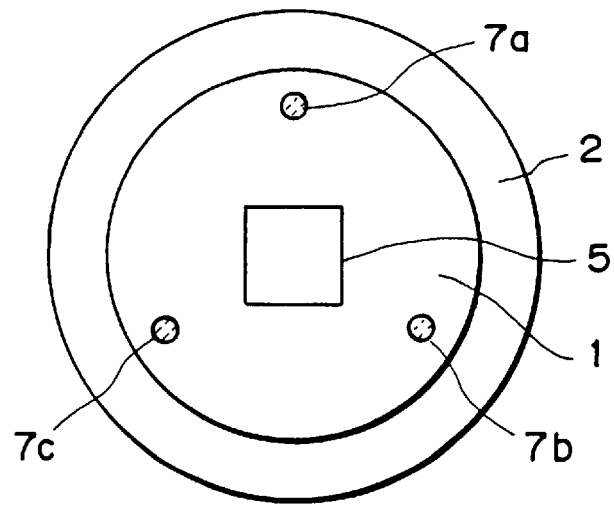

FIGS. 6A and 6B illustrate an embodiment of the present invention, which uses ultraviolet laser radiation. As compared with the preceding embodiment, in this embodiment the relationship between the mask substrate 1 and the glass supporting frame 2 is inverted. Namely, ultraviolet laser radiation is projected from the supporting frame 2 side. Since ultraviolet radiation passes through glass, projection of ultraviolet radiation from the glass supporting frame 2 side still enables the anodic bonding of it with the X-ray mask substrate 1.

Denoted in FIG. 6A at 31 are ultraviolet laser sources each providing ultraviolet laser light 15. The first base 9b is provided with openings 14 at four locations corresponding to the position of projection of the laser radiation 15. In this example, while projecting laser radiation 15 to the supporting frame through the openings 14, a high voltage of 1000–10000 V. is applied between the X-ray mask substrate 1 and the conductive member 11, this being continued for a period not shorter than 10 min. Simultaneously, cooling water is flowns as in embodiment described above so as to keep the mask substrate 1 and the glass supporting frame 2 at a predetermined normal temperature (about the mask temperature in a lithographic pattern transfer process in which the X-ray mask is actually used). The light projecting step is continued for a period not shorter than 10 min., by which anodic bonding of the mask substrate 1 with the supporting frame 2 is done.

FIG. 6B illustrates bonding positions. The bonding can be called as "spot bonding" with ultraviolet radiating having a beam diameter of 2–10 mm. While in this example bonding is done at three points, a desired number of bonding points may be selected in a range of one (1) to several tens.

Figure 7:
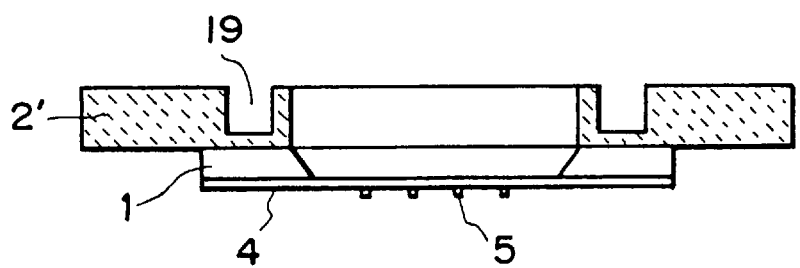
FIG. 7 illustrates a modified form of a mask.

FIG. 7 illustrates a modified form of an X-ray mask in which the portion of a supporting frame 2' corresponding to the anodic bonding area is cut to reduce the thickness. This is effective to reduce the energy absorbed as the ultraviolet laser radiation passes through the glass supporting frame and thus to reduce the time necessary for the anodic bonding.

In the examples described just above, the X-ray mask substrate 1 on which the X-ray absorbing material 5 is provided beforehand is fixed to the supporting frame 2 through tho anodic bonding process. However, an X-ray mask substrate without an X-ray absorbing material may be first bonded to a glass supporting frame through the anodic bonding process and, thereafter, the X-ray absorbing material may be provided on the mask substrate.

Embodiment 5

Figure 8A:
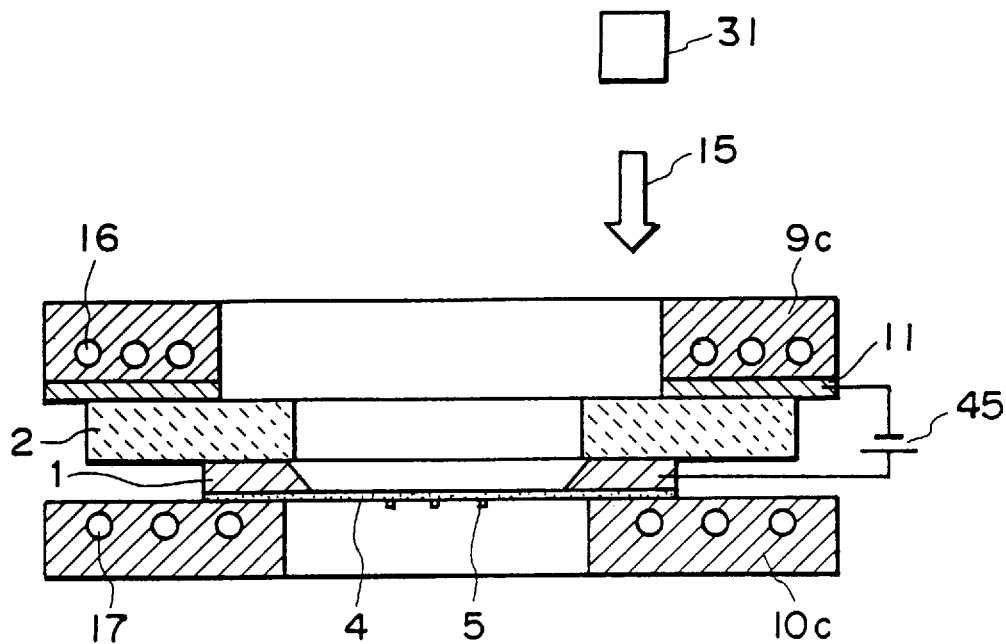
FIGS. 8A and AB are schematic views for explaining a fifth embodiment of the present invention.
Figure 8B:
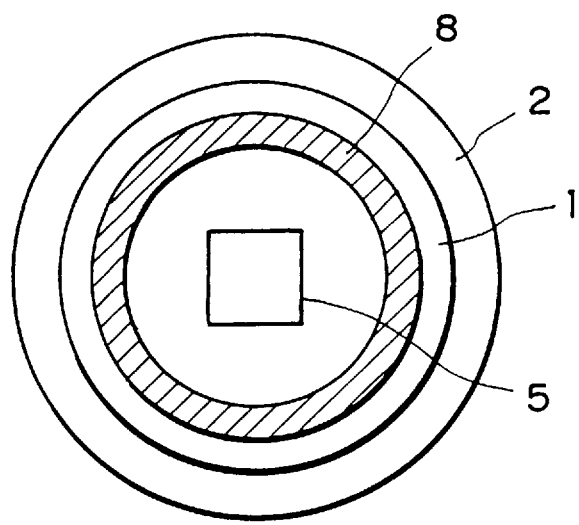

Next, a description will be made of another embodiment of the present invention which uses ultraviolet laser radiation, as in the fourth embodiment. Referring to FIG. 8A, the structure illustrated in this drawing is the same as that of the third embodiment, except for the shape of a first base 9c. The first base 9c has an enlarged inside diameter so as not to interfere with the laser, and the infrared laser radiation is projected to the supporting frame 2 in a circular shape. Here, the ultraviolet laser is scanningly deflected along a circumferential direction at a slow rotating speed, such as 0.5–2 (time/rotation) for example, whereby ring-like anodic bonding is made at the bonding area 8 (FIG. 8B). In place of scanningly deflecting the laser radiation, the laser may be held fixed and the mask supporting mechanism may be rotated.

Embodiment 6

Figure 9:
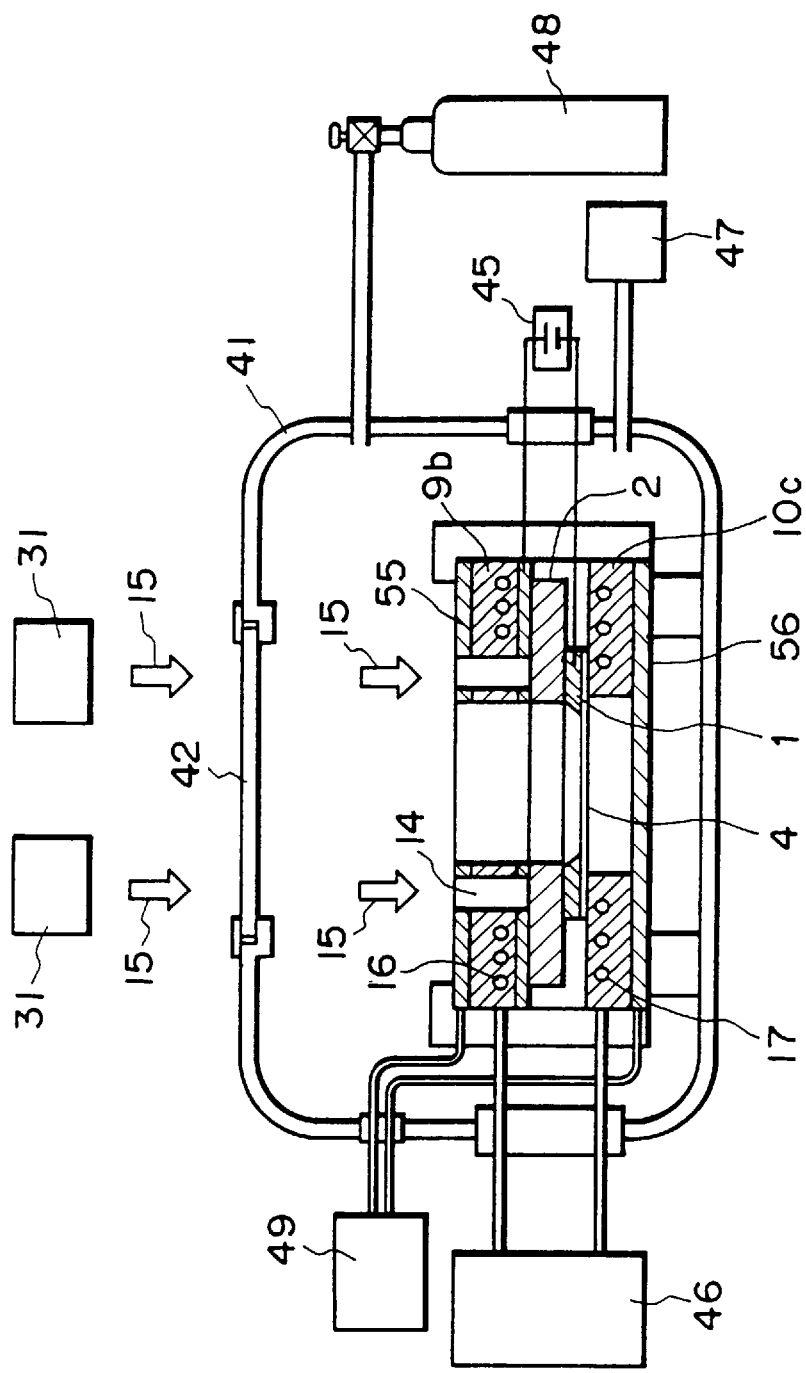
FIG. 9 is a schematic view for explaining a sixth embodiment of the present invention.

FIG. 9 illustrates a general arrangement of a mask manufacturing apparatus according to a sixth embodiment of the present invention. Like numerals as those of the foregoing embodiments are assigned to corresponding elements.

Basically, this embodiment corresponds to such a form that the structure shown in FIG. 6 is accommodated in a gas-tight chamber 41. The first base 9b is provided with a heater 55, while the second base 10c is provided with another heater 56. These heaters are controlled by a heater controller 49. Window member 42 is made of a material (e.g. silica glass) transmissive to the ultraviolet laser.

In this embodiment, while the X-ray mask substrate 1 (Si) and the supporting frame 2 (heat resisting glass) are heated by the heaters 55 and 56 to a temperature (e.g., about 100–200 deg.(C.)) whereat deformation due to the linear expansion coefficient is small, a voltage of a current of a few $\mu$A as well as the ultraviolet laser are applied, whereby anodic bonding is done. With such low temperature heating, dispersion of modifier ions within the glass is accelerated and, as a result, the tightness of anodic bonding is improved.

Embodiment 7

Figure 10:
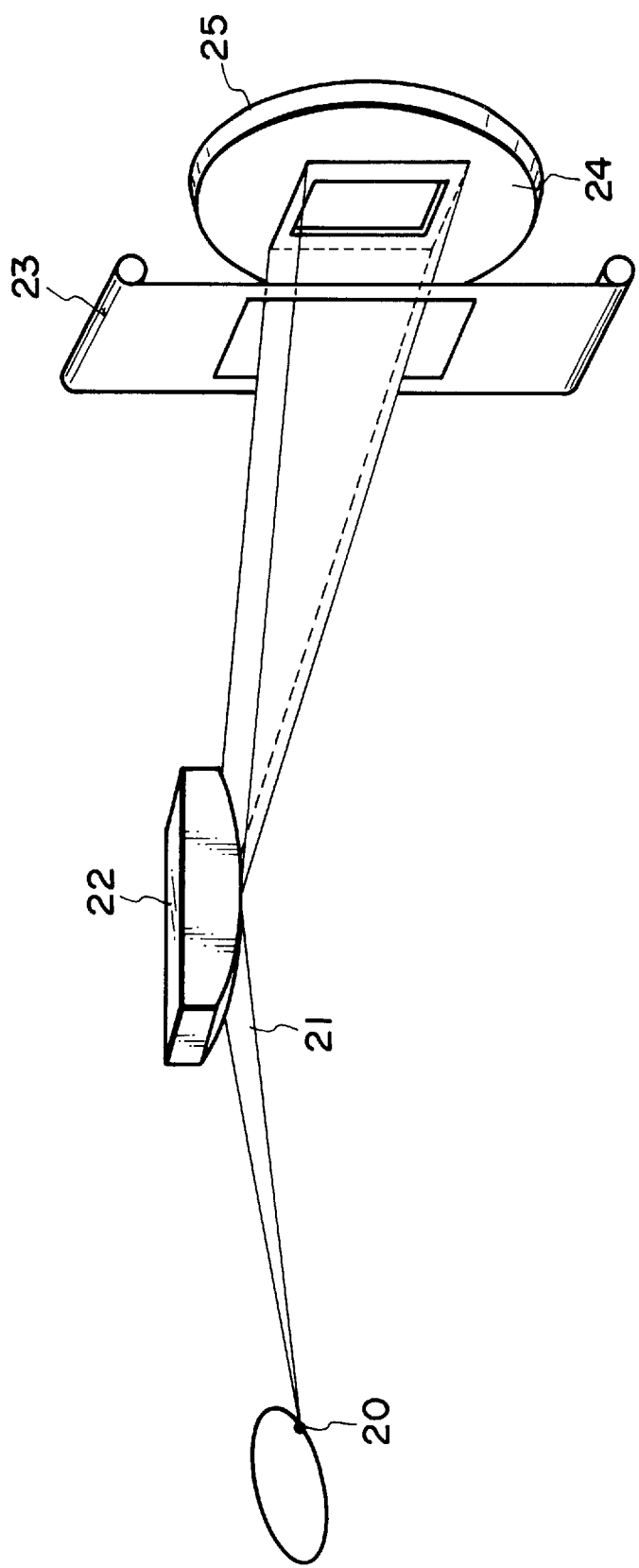
FIG. 10 is a schematic view for explaining an embodiment which is applied to an X-ray exposure apparatus.

Next, a description will be made of an embodiment of the present invention which is applied to an exposure apparatus for the manufacture of microdevices such as semiconductor devices, thin film magnetic heads or micromachines, for example. FIG. 10 illustrates a general arrangement of an X-ray exposure apparatus according to this embodiment. Synchrotron radiation 21 having a sheet beam shape, emitted from an SR radiation source 21, is expanded by a convex mirror 22 in a direction perpendicular to the orbit plane of radiation. The radiation reflected and expanded by the mirror 22 goes to a shutter 23 which serves to adjust the exposure so that a uniform exposure amount is assured within the region of irradiation. The radiation passing through the shutter 23 impinges on an X-ray mask 24. This mask is manufactured in accordance with the method (or apparatus) described with reference to any one of the preceding embodiments. Through a step-and-repeat process or a scanning process, a pattern formed on the mask 24 is lithographically transferred onto a wafer 25.

Embodiment 8

Next, an embodiment of a device manufacturing method based on an exposure apparatus described above, will be explained.

Figure 11:
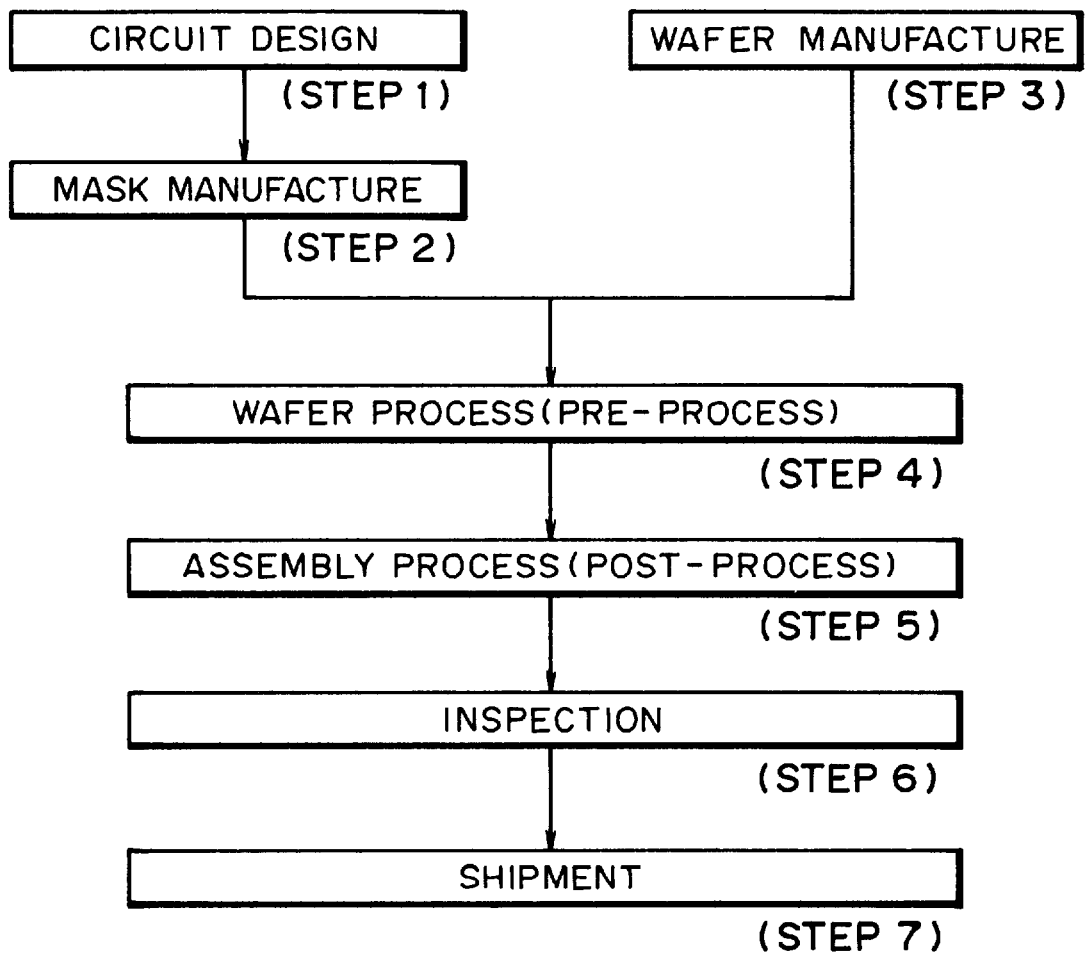
FIG. 11 is a flow chart of semiconductor device manufacturing processes.

FIG. 11 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer through lithography. Step 5 subsequent to this is an assembling step which is called a post-process wherein the water processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 12:
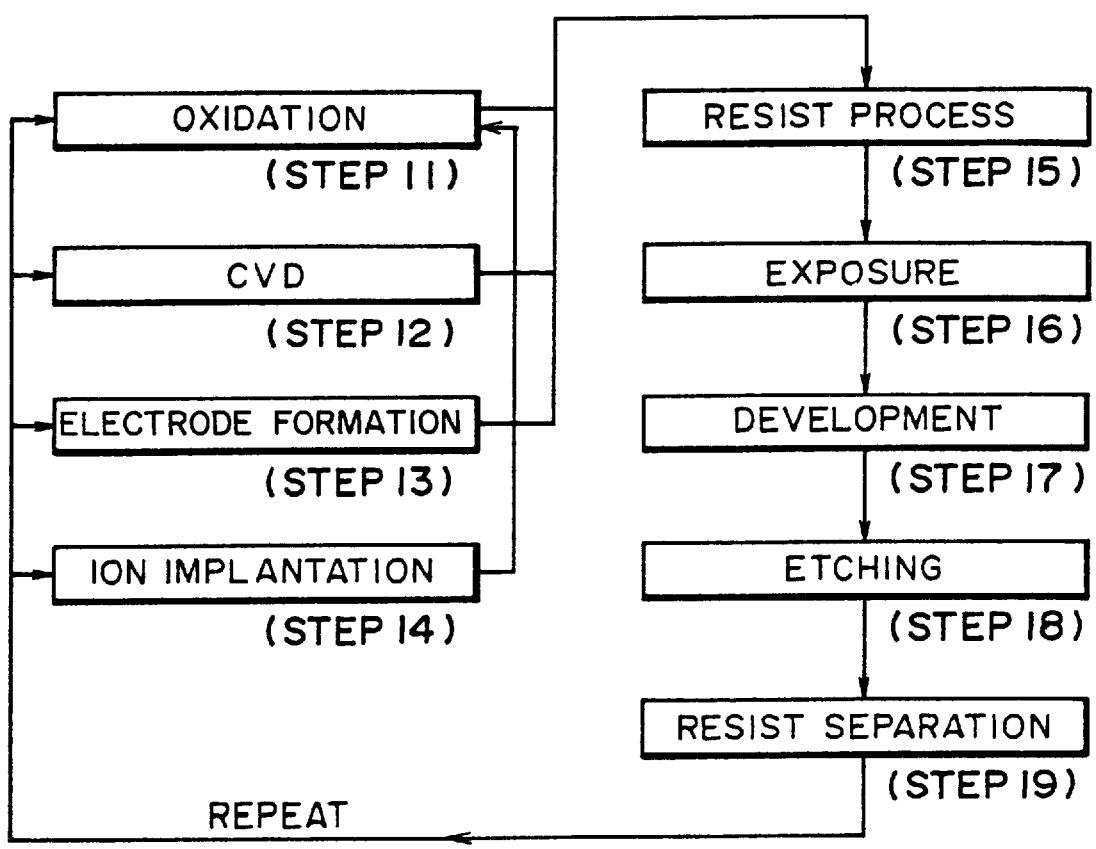
FIG. 12 is a flow chart of a wafer process.
Figure 13:
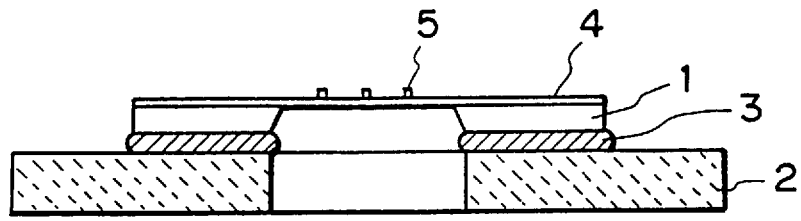
FIGS. 13 and 14 are schematic views, respectively, for explaining masks of known examples.
Figure 14:
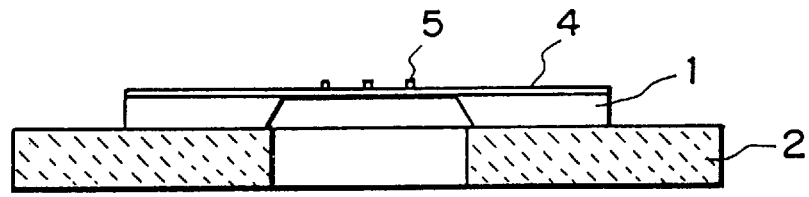

FIG. 12 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are supposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A method of manufacturing a mask, comprising the steps of:

applying a voltage between a mask substrate and a supporting frame, wherein the mask substrate and the supporting frame have a significant difference between them in linear expansion coefficient; and irradiating the mask substrate and the supporting frame, at a plurality of bonding points, with coherent radiation to effect anodic spot-bonding of the mask substrate and the supporting frame, wherein one of the mask substrate and the supporting frame has a small-thickness portion and the coherent radiation is projected to the small-thickness portion from the side of the one of the mask substrate and the supporting frame having the small-thickness portion.

2. A method according to claim 1, further comprising controlling temperatures of the mask substrate and the supporting frame during the anodic bonding process.

3. A method according to claim 1, wherein the mask to be manufactured is an X-ray exposure mask.

4. A method of manufacturing a mask, comprising the steps of:

applying a voltage between a mask substrate and a supporting frame therefor; and irradiating the mask substrate and the supporting frame with coherent radiation to effect anodic bonding of the mask substrate and the supporting frame, wherein one of the mask substrate and the supporting frame has a small-thickness portion and the coherent radiation is projected to the small-thickness portion from the side of the one of the mask substrate and the supporting frame having the small-thickness portion.

5. A method according to claim 4, wherein the mask to be manufactured is an X-ray exposure mask.

6. A method of manufacturing a mask, comprising the steps of:

applying a voltage between a mask substrate and a supporting frame therefor;

irradiating, with coherent radiation, the mask substrate and the supporting frame in one of a high vacuum ambience and an inert gas ambience, to effect anodic bonding of the mask substrate and the supporting frame; and cooling a portion of the mask substrate and the supporting frame, irradiated with the coherent radiation, during the anodic bonding process to keep a predetermined normal temperature.

7. A method according to claim 6, wherein the mask to be manufactured is an X-ray exposure mask.

* * * * *

UNITED STATES PATENT AND TRADEMARK OFFICE
CERTIFICATE OF CORRECTION

PATENT NO. : 5,861,603

DATED : January 19, 1999

INVENTORS : TAKESHI MIYACHI, ET AL.

Page 1 of 2

It is certified that error appears in the above-identified patent and that said Letters Patent is hereby corrected as shown below:

COLUMN 1:

line 16, "of it" should read --of--; and
    line 41, "Accordance" should read --accordance--.

COLUMN 2:

line 5, "layer" should read --large--;
    line 14, "Am" should read --As--;
    line 19, "Is" should read --is--;
    line 27, "a" should be deleted; and
    line 33, "frame," should read --frame.--.

COLUMN 3:

line 18, "them" should read --them.--;
    line 37, "is flowns" should read --flows--;
    line 38, "ill" should read --in--; and
    line 44, "shorter-than" should read --shorter than--.

COLUMN 4:

line 39, "light" should read --radiation,--; and
    line 65, "A1$_2$O$_3$," should read --Al$_2$O$_3$,--.

UNITED STATES PATENT AND TRADEMARK OFFICE
CERTIFICATE OF CORRECTION

PATENT NO. : 5,861,603

DATED : January 19, 1999

INVENTORS : TAKESHI MIYACHI, ET AL.

It is certified that error appears in the above-identified patent and that said Letters Patent is hereby corrected as shown below:

COLUMN 5:

line 31, "is flowns as in" should read --flows as in the--.

COLUMN 6:

line 64, "water" should read --wafer--.

Signed and Sealed this

Fourteenth Day of September, 1999

Attest:

Q. TODD DICKINSON

*Attesting Officer*      *Acting Commissioner of Patents and Trademarks*